United States Patent
Buhlmann et al.

(10) Patent No.: US 11,422,162 B2
(45) Date of Patent: Aug. 23, 2022

(54) CURRENT TRANSDUCER WITH COIL FORMER

(71) Applicant: LEM INTERNATIONAL SA, Plan-les-Ouates (CH)

(72) Inventors: Félix Buhlmann, Lausanne (CH); Pascal Morel, Saint-Pierre-en-Faucigny (FR)

(73) Assignee: LEM International SA, Plan-les-Ouates (CH)

( * ) Notice: Subject to any disclaimer, the term of this patent is extended or adjusted under 35 U.S.C. 154(b) by 0 days.

(21) Appl. No.: 17/598,390

(22) PCT Filed: Mar. 18, 2020

(86) PCT No.: PCT/EP2020/057495
§ 371 (c)(1),
(2) Date: Sep. 27, 2021

(87) PCT Pub. No.: WO2020/200795
PCT Pub. Date: Oct. 8, 2020

(65) Prior Publication Data
US 2022/0099707 A1 Mar. 31, 2022

(30) Foreign Application Priority Data
Mar. 30, 2019 (EP) .................................... 19166430
Sep. 12, 2019 (EP) .................................... 19197136

(51) Int. Cl.
*B23P 19/00* (2006.01)
*G01R 15/18* (2006.01)
(Continued)

(52) U.S. Cl.
CPC ........... *G01R 15/183* (2013.01); *H01F 27/02* (2013.01); *H01F 27/24* (2013.01); *H01F 27/28* (2013.01);
(Continued)

(58) Field of Classification Search
CPC ....... G01R 15/183; H01F 27/02; H01F 27/24; H01F 27/28; H01F 41/0206
See application file for complete search history.

(56) References Cited

U.S. PATENT DOCUMENTS 7,221,252 B1 * 5/2007 Chang ..................... H01F 38/10
336/212
8,497,677 B2 * 7/2013 Miyahara ................. H01F 3/14
324/244

(Continued)

FOREIGN PATENT DOCUMENTS

EP 1855119 11/2007

OTHER PUBLICATIONS

International Search Report and Written Opinion issued by the International Searching Authority, dated Jun. 3, 2020, for International Patent Application No. PCT/EP2020/057495; 12 pages.

*Primary Examiner* — Paul D Kim
(74) *Attorney, Agent, or Firm* — Faegre Drinker Biddle & Reath LLP (57) ABSTRACT

Current transducer including a housing comprising a coil support, a magnetic core extending between a first end and a second end, and a coil comprising a plurality of windings formed around the coil support. The coil support comprises a core receiving channel within which the magnetic core is inserted, the coil support comprising a radially inner support portion and a radially outer support portion between which the core receiving channel is disposed. The radially inner support portion is slidably movable with respect to the radially outer support portion.

19 Claims, 5 Drawing Sheets

(51) Int. Cl.
*H01F 27/02* (2006.01)
*H01F 27/24* (2006.01)
*H01F 27/28* (2006.01)
*H01F 41/02* (2006.01)

(52) U.S. Cl.
CPC ....... *H01F 41/0206* (2013.01); *G01R 15/186* (2013.01)

(56) References Cited

U.S. PATENT DOCUMENTS 10,126,327 B2 * 11/2018 Morel .................... G01R 1/04
2010/0097049 A1    4/2010 Lepine
2017/0010310 A1    1/2017 Morel

* cited by examiner

FIG 3  FIG 4a  FIG 4b

CURRENT TRANSDUCER WITH COIL FORMER

CROSS-REFERENCE TO RELATED APPLICATIONS

The present application is a national stage entry of International (PCT) Patent Application Number PCT/EP2020/057495, filed Mar. 18, 2020, which in turn claims priority to European Patent Application No. 19166430.9, filed Mar. 30, 2019, and European Patent Application No. 19197136.5, filed Sep. 12, 2019, the subject matter of which are expressly incorporated herein by reference.

The present invention relates to an electric current transducer or an electric current transformer comprising a magnetic core and a secondary coil mounted around the magnetic core.

Electrical current transducer modules for current sensing applications typically comprise a magnetic core made of a high permeability magnetic material, surrounding a central aperture through which passes a primary conductor carrying the current to be measured. The magnetic core may typically have a generally rectangular or circular shape and, depending on the configuration, may be provided with an air-gap in which a magnetic field detector, such as a Hall effect sensor in the form of an ASIC, or a fluxgate sensor, is positioned. The magnetic flux generated by the electrical current flowing in the primary conductor is concentrated by the magnetic core and is representative of the primary current. In current sensors of the closed-loop type the magnetic field sensor is connected in a feed-back loop to a compensation coil, also generally called a secondary coil, which is typically wound around a portion of the magnetic core in order to generate a compensation current that tends to cancel the magnetic field generated by the primary conductor. The compensation current thus represents an image of the current to be measured. Secondary coils are also employed in current transducers of the open-loop type, but as pick-up coils that measure the magnetic field concentrated in the magnetic core in a transformer effect.

An electric current transformer can be thought of as a closed-loop current transducer without electronics. By reference to the generic term "current transducer" herein it is also meant to encompass current transformers, which may be considered to be a particular form of current transducer.

The coil mounted around the magnetic core may be assembled in various manners. In certain current transducers, the coil is wound around the magnetic core by passing the wire through the air gap. This however requires special tooling and is a costly process. Moreover, such process is not well adapted to the winding of coils with a large number of turns extending over a long section of the magnetic core. Also, for small current transducers, using such winding technique is difficult or impossible.

Another known manufacturing method is to bend the magnetic core, or at least a branch thereof, to present laterally offset ends of the core branches forming the air gap to allow insertion of the coil over one of the core branch ends until, and to subsequently bend the branches to align their ends forming the airgap in which the magnetic field detector is positioned. This requires plastic deformation of the magnetic core which has the drawback of modifying the soft magnetic properties of the magnetic core. Mounting of the coil on the magnetic core and subsequent annealing to restore the material properties is not possible and thus the performance of the current transducer may be affected by the altered magnetic material properties of the magnetic core.

The ability to wind the coil around a coil support is however significantly more advantageous from a manufacturing standpoint, especially for coils with large number of turns that extend along a long section of the magnetic core. The loss in performance due to the plastic deformation of the magnetic core is therefore often tolerated due to gains in reduced manufacturing cost and complexity.

It may be noted that the invention may advantageously also be employed more generally in inductive components comprising a coil positioned around a magnetic core, for applications outside the field of current measurement.

It is an object of this invention to provide an electrical current transducer with a coil mounted around a magnetic core that it is economical to produce yet that has a high performance.

It is advantageous to provide electrical current transducer that is compact that has a high and reliable measurement range.

Objects of the invention have been achieved by providing a current transducer according to claim 1, and methods of assembling a current transducer according to claims 16 or 17.

Disclosed herein is a current transducer including a housing comprising a coil support, a magnetic core extending between a first end and a second end, and a coil comprising a plurality of windings formed around the coil support. The coil support comprises a core receiving channel within which the magnetic core is inserted, and a radially inner support portion and a radially outer support portion between which the core receiving channel is disposed. The radially inner support portion is slidably movable with respect to the radially outer support portion.

In a first embodiment, the first and second ends of the magnetic core form a magnetic circuit gap therebetween. In this first embodiment, the current transducer may in particular comprise a magnetic field detector that is mounted in the magnetic circuit gap.

In a second embodiment, the magnetic core extends around in a closed ring shape more than 360° such that the core ends overlap a section of the magnetic core. In this second embodiment, the current transducer may in particular be in the form of a current transformer.

In an advantageous embodiment, the magnetic core extends around about 720°.

In an advantageous embodiment, the coil support comprises spacer elements arranged between a radially inner support portion and radially outer support portion, configured to allow relative displacement between the radially and inner support portion and the radially outer support portion while maintaining a space between the support portions to form the core receiving channel.

In an advantageous embodiment, the spacer elements are in the form of tabs arranged along lateral edges of the radially inner and radially outer support portions.

In an advantageous embodiment, the spacer elements are formed integrally extending from the radially inner support portion.

In an advantageous embodiment, there are between three and ten, preferably between four and eight spacer elements on each lateral side of the coil support.

In an advantageous embodiment, the housing further comprises a base from which extends the coil support.

In an advantageous embodiment, the coil support is integrally formed with and extends from the base of the housing.

In an advantageous embodiment, the first end and second end of the magnetic core are inserted in respective cavities in the base of the housing.

In an advantageous embodiment, the base comprises locking elements engaging the magnetic core at its second end for locking the magnetic core in its fully assembled position to the housing.

In an advantageous embodiment, the housing base comprises a mounting face configured for mounting on a circuit board, the magnetic field detector being inserted in a magnetic field detector lodging cavity extending into the housing from the mounting face such that the magnetic field detector is insertable in the housing through the mounting face.

In an advantageous embodiment, the first end of the magnetic core is arranged parallel to the second end of the magnetic core forming the magnetic circuit gap therebetween, the second end connected to a main portion of the magnetic core via a bend, for instance an approximately right angle bend.

In an advantageous embodiment, the magnetic core comprises an essentially rectangular cross-sectional profile, the magnetic core being formed from a rectangular strip of soft magnetic material.

Also disclosed herein is a method of assembling a current transducer, wherein a first end of the magnetic core is inserted into a core receiving channel of the core support from a free end, the magnetic core being translated in an axial direction towards a base of the housing.

In an advantageous embodiment, the coil is wound around the coil support prior to assembly of the core support to the magnetic core, the core support being in an essentially linear shape during the winding of the coil.

In an advantageous embodiment, the coil is wound around the core support of the housing by fixing the housing in a rotatable tool, the housing being rotated while a wire forming the coil is fed and laterally displaced between the first end and second end of the coil support in a to and fro motion during the rotation of the housing Further objects and advantageous features of the invention will be apparent from the claims, from the detailed description, and annexed drawings, in which:

FIGS. 1a and 1b are a perspective views, and FIG. 1c a bottom view, of a current transducer according to an embodiment of the invention;

FIG. 2 is a cross-sectional view through line II-II of FIG. 1c;

FIG. 7a is a top view of a current transducer according to a second embodiment of the invention;

FIG. 7b is a cross-sectional view through line VIIb-VIIb of FIG. 7a;

FIG. 7d is a side view illustrating assembly insertion of a magnetic core to the housing and coil of the current transducer according to the second embodiment of the invention.

Referring to the figures, a current transducer 1 according to an embodiment of the invention comprises a housing 2, a magnetic core 5 and a coil 6 having a plurality of windings position around the magnetic core.

In a first embodiment, illustrated in FIGS. 1a-6c, the transducer comprises a magnetic field detector 7 mounted in a magnetic circuit gap (typically called an airgap) formed between ends 20a, 20b of the magnetic core 5.

In a second embodiment illustrated in FIGS. 7a-7d, the transducer is in the form of a current transformer.

The magnetic core 5 forms a circuit surrounding a central passage 9 through which a primary conductor carrying a current to be measured may be inserted. The primary conductor may have a single strand or may be wound one or a plurality of times around a branch of the magnetic core.

The coil 6 may be a compensation coil carrying a current that seeks to cancel the magnetic field generated by the primary conductor as per se well known in closed loop current transducers. In a variant, the coil may instead form a current transformer for open loop applications, also as per se well known in the field of current measurement. In a variant, there may be a plurality of coils, for instance two coils whereby for instance a first coil constitutes the primary conductor and a second coil constitutes the compensation coil. In yet further variants, there may be more than two coils, for instance a plurality of primary conductors may be wound around the magnetic core in addition to the compensation coil. Optionally, at least one of the coils can serve as an electrostatic shield. The shielding coil may be wound to form one or a few layers around the magnetic core or a first or more coils positioned thereunder.

In the first embodiment, the magnetic field detector 7 may be of various types per se well known in the field of current measurement, for instance a fluxgate detector, or a Hall effect detector, for instance in a form of an application specific integrated circuit (ASIC) as illustrated, comprising connection terminals 25 for connection to a circuit board or for integration in a connector such as a pluggable connector. Such connection configurations are also per se well known in the field of current transducers.

The housing 2 comprises at least a coil support 4.

In an embodiment, the housing may optionally further comprise a base 3, as shown in the illustrated embodiments in FIGS. 1a-6c. In the illustrated embodiment of FIGS. 1a-6c, the coil support 4 extends from the base 3. The coil support 4 is in the illustrated embodiment advantageously integrally formed with the base 3. The integrally formed base and core support may be formed by injection molding or other molding technics, or by additive manufacturing technics such as 3D printing, of an insulating material such as a polymer. The housing may however be made of two or more parts that are fixed together by means of clips or other mechanical means or that are fixed together by welding or adhesive bonding.

The base comprises, in the illustrated embodiment of FIGS. 1a-6c, a mounting face 23 with circuit board fixing elements 24 for connection and mounting of the transducer on a circuit board. However in a variant, the base may comprise a connector, for instance for pluggable connection to a complementary connector, instead of the circuit board mounting configuration.

In the illustrated embodiment of FIGS. 1a-6c, the connection terminals 25 of the magnetic field detector 7 and coil connection terminals 8 extend to the mounting face 23 for electrical connection to the circuit board. The coil connection terminals 8 may be integrally molded or stitched or otherwise fixed in the base 3. In the illustrated embodiment, the coil connection terminals comprise posts for connection to ends of a wire conductor forming the coil 6.

The coil 6 is preferably formed of a conducting wire, such as a copper wire per se well known in the art. However, in variants, the coil may be formed of a flat strip or band, comprising a thin insulating support, for instance a polymer support, with a conductive track printed or deposited thereon, the band being configured for winding around the coil support 4.

In the embodiment of FIGS. 1a-6c, the base 3 comprises a magnetic field detector lodging cavity 18 into which the magnetic field detector 7 is inserted, and core first and second end lodging cavities 16, 17 receiving respective first end second ends 20a, 20b of the magnetic core therein on opposite sides of the magnetic field detector 7, the lodging cavities 16, 17 serving to guide and position the ends 20a, 20b of the magnetic core to accurately define the air gap.

In the embodiment of FIGS. 1a-6c, the magnetic core comprises said first end 20a arranged parallel to said second end 20b, the second end 20b being connected to the magnetic core main portion via a bend 21 to allow the magnetic core ends 20a, 20b to extend parallel to each other and form the air gap there between.

The magnetic core 5 is in the illustrated embodiments advantageously in the form of a flat strip of soft magnetic material that is bent into a fully closed (FIGS. 7a-7d) or an almost closed ring or oval shape (FIGS. 1a-6c) as illustrated, the cross sectional profile of the magnetic core having an essentially rectangular form where the large surfaces of the rectangle are on the radially inner and radially outer surfaces.

The cross-sectional profile of the magnetic core could however have other shapes for instance oval, elliptical, polygonal, circular or even irregular. The magnetic core is made of a soft magnetic material, such materials being per se well known in the art of current transducers. The magnetic core is formed into its final shape and subsequently annealed to homogenize the magnetic properties within the magnetic core. The magnetic core during assembly of the housing and coil may slightly deform, but such deformation remains in the elastic domain such that it is not subject to plastic deformation that could alter the properties of the soft magnetic material of the core.

The coil support 4 comprises a radially inner support portion 10 and a radially outer support portion 12 forming there between a core receiving channel 13. The coil support portion 4 extends from a base end portion 14, which depending on the embodiment may be fixed or integrally formed with the base 3, to a free end portion 15 at the other extremity of the coil support 4.

In the embodiment of FIGS. 1a-6c, the core receiving channel 13 at the base end 14 extends into and is aligned with the core first end lodging cavity 16 in the base 3.

Figures 1A, 1B, 1C, 2:
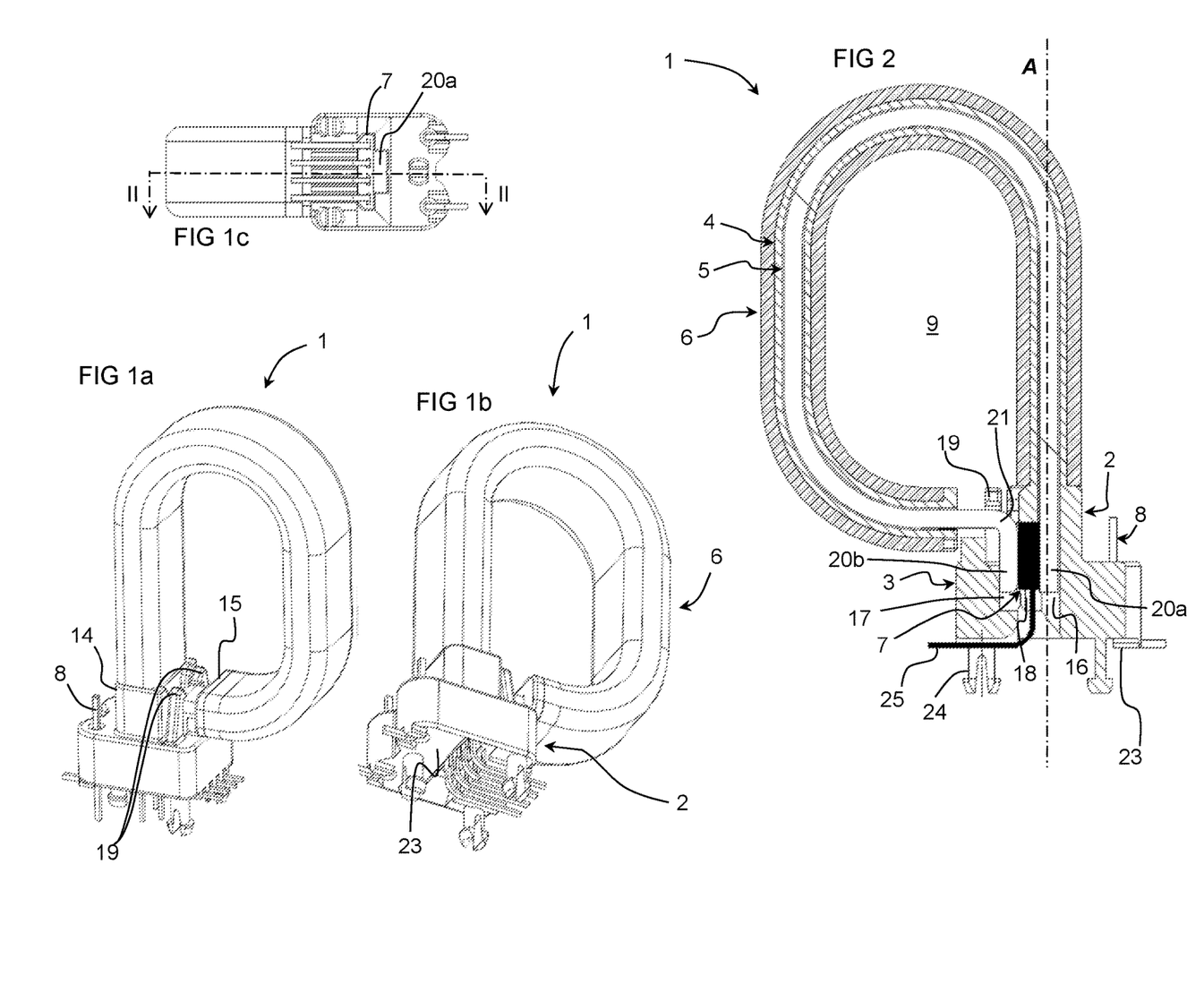
Figure 3:
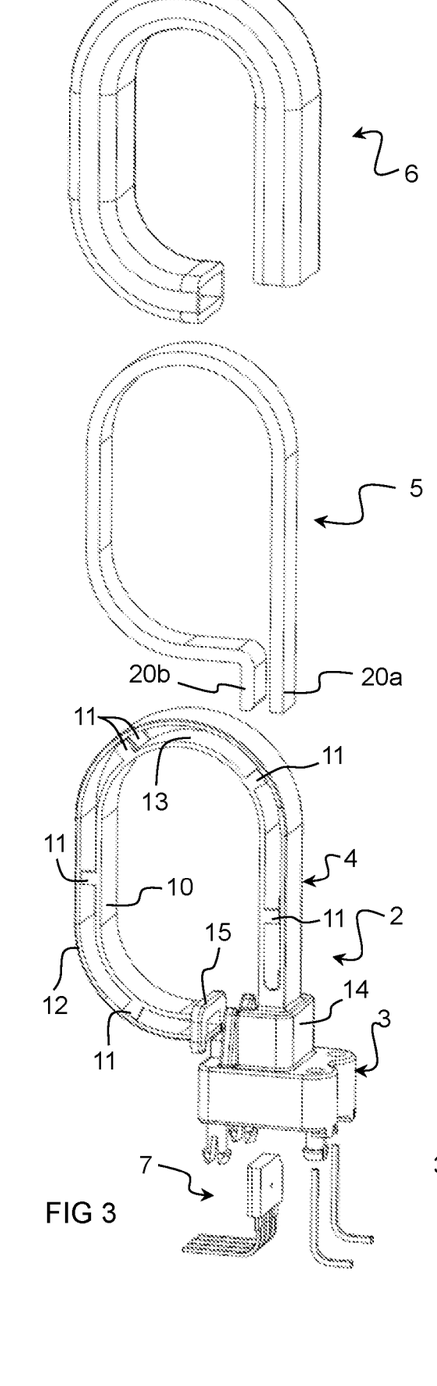
FIG. 3 is an exploded perspective view of a current transducer according to an embodiment of the invention.
Figure 4A:
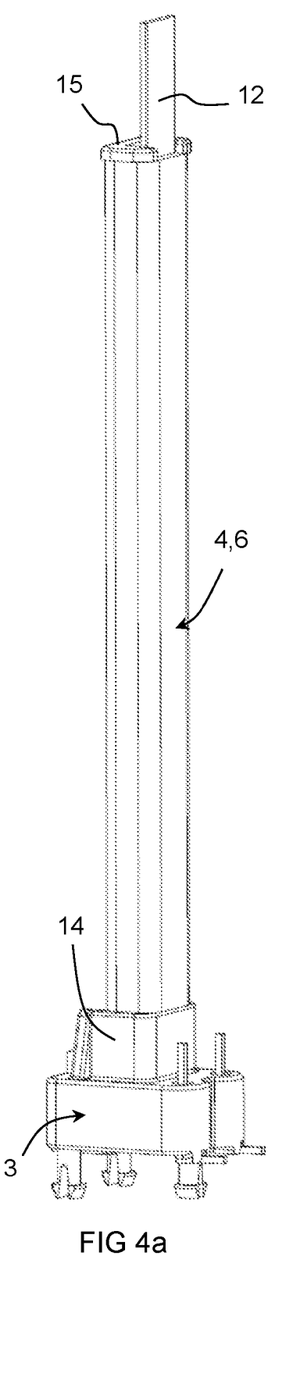
FIGS. 4a and 4b are perspective views of a housing and coil of the current transducer according to an embodiment of the invention.
Figure 4B:
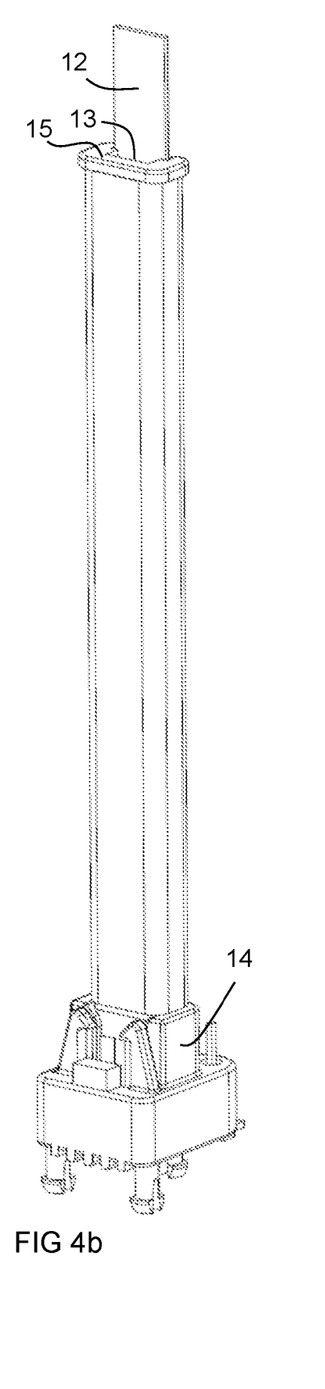

The coil support further comprises spacer elements 11 that maintain a certain gap between the radially inner support portion 10 and radially outer support portion 12 to ensure that the core receiving channel 13 is formed therebetween, the spacer elements 11 allowing a relative displacement between the radially inner support portion 10 and radially outer support portion 12 over a major portion of the length of the coil support 4. The latter allows the radially inner support portion 10 and radially outer support portion 10 to be formed straight as illustrated in FIGS. 4a, 4b, and 7c, and yet to be bendable into the assembled shape conforming to the shape of the magnetic core 5 as illustrated in FIGS. 1a to 3, and 7b, taking into account the different lengths of the radially outer and radially inner perimeters when bent.

In the illustrated embodiments of FIGS. 1a-6c and 7a-7d, the spacer elements 11 (shown in FIG. 3, but also present in the second embodiment) are integral with the radially inner support portion and extend from lateral edges of the radially inner support portion 10, leaving a gap therebetween for the magnetic core 5.

The spacer elements 11 may advantageously be in a form of tabs, a plurality arranged in a spaced part manner between the base end 14 and the free end 15, of the coil support 4, for instance between four and ten spacer elements on each lateral side. The spacer elements 11 may also serve as a lateral guide for the magnetic core 5 to position a magnetic core laterally within the core receiving channel 13.

The free end portion 15 of the coil support 4 may advantageously be integrally formed with the radially inner support portion 10 and defines an end flange for the coil 6 wound around the coil support.

Figures 7A, 7B, 7D:
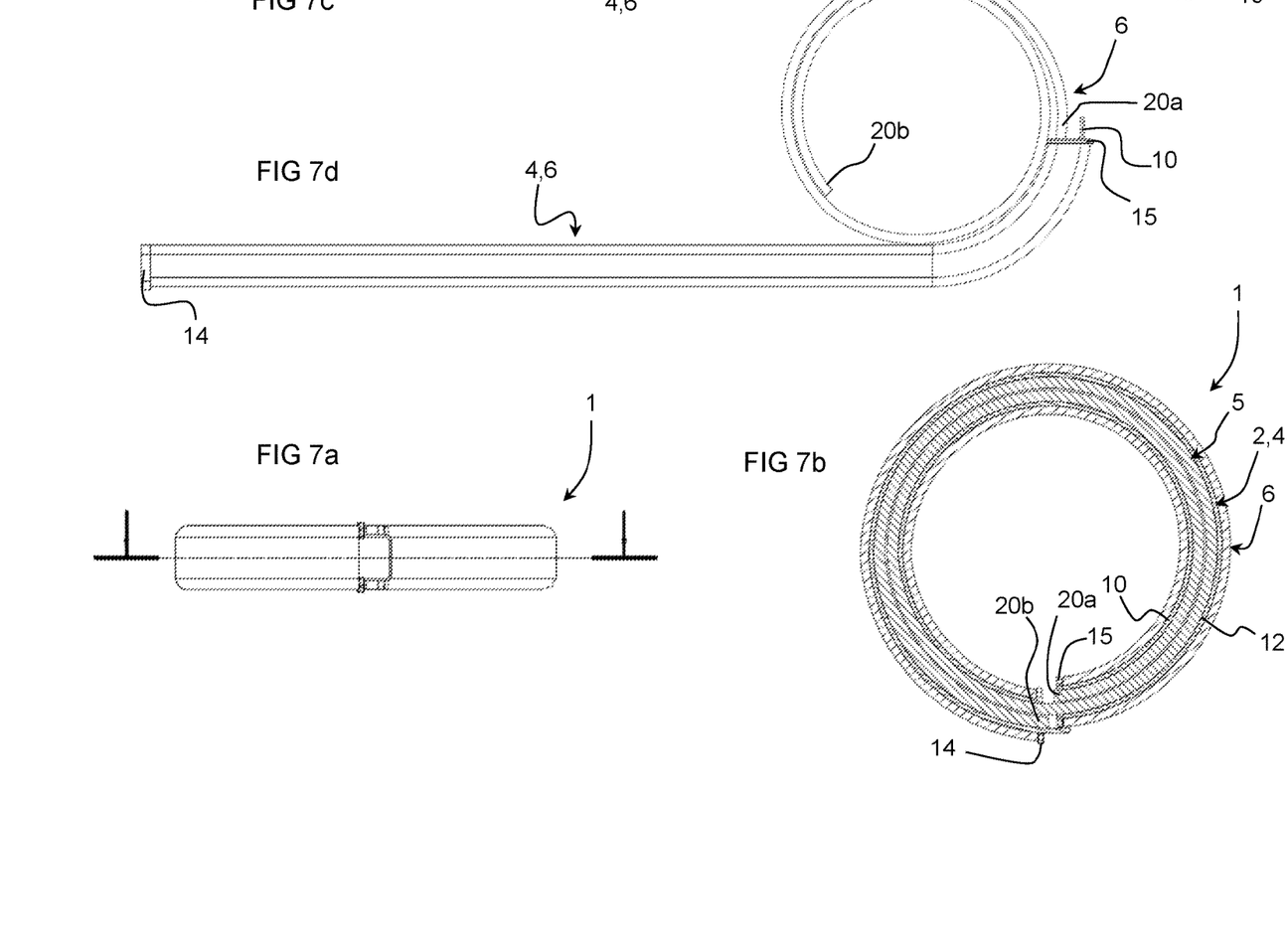
Figure 7C:
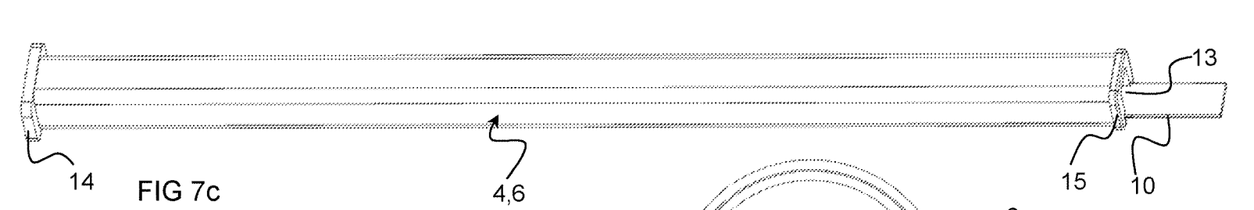
FIG. 7c is a perspective view of a housing and coil of a current transducer according to the second embodiment of the invention.

As illustrated in FIGS. 4a, 4b, and 7d, the coil may be wound on the coil support 4 while it is in a linear or straight form. This allows the coil to be wound around the coil support 4 by fixing the housing 2 in a tool that rotates the housing while the coil wire is fed and simultaneously displaced between the base end 14 and free end 15 in a to and fro motion. As this movement is relative, it is of course possible to displace the housing 2 in a to and fro motion and to wind the wire around the housing. In an advantageous embodiment however the housing 2 is preferably mounted in a rotating tool.

Figures 5A, 5B, 5C:
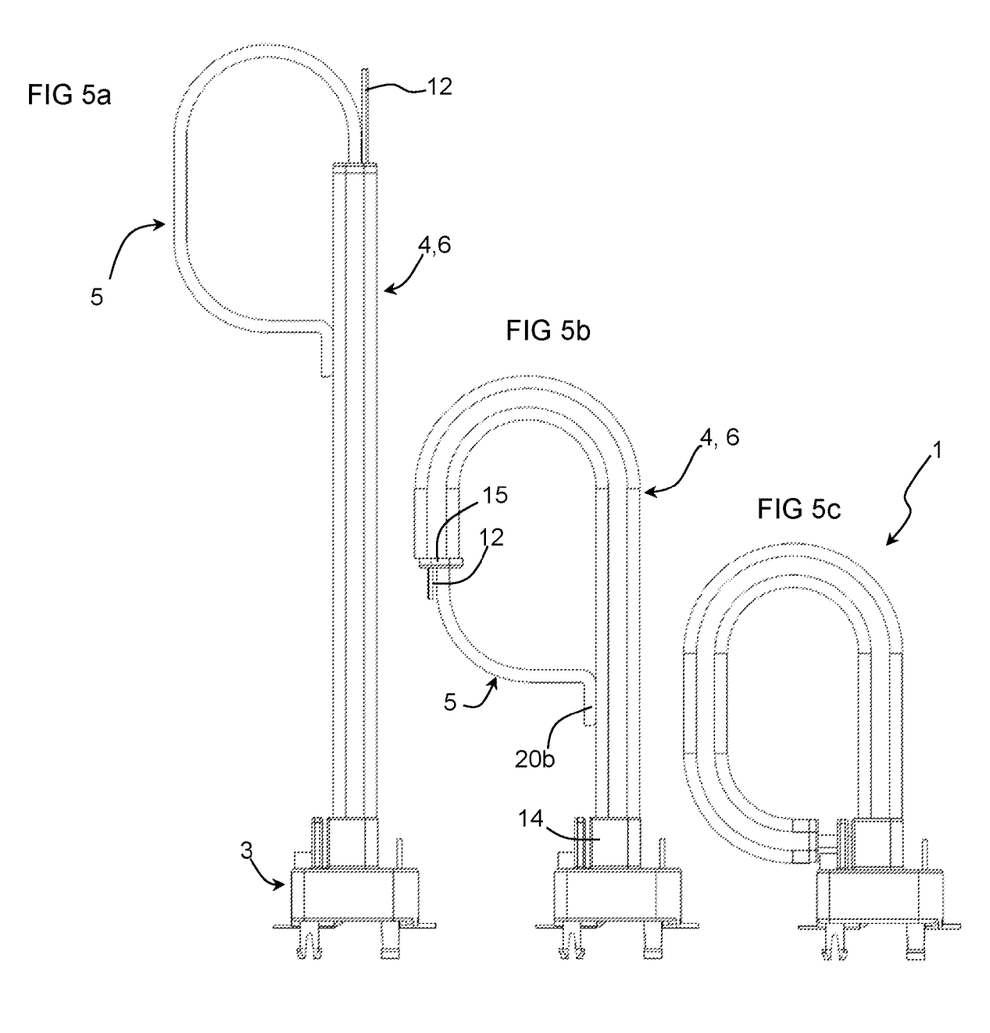
FIGS. 5a to 5c are side views and FIGS. 6a to 6c perspective views illustrating assembly insertion of a magnetic core to a housing and coil of the current transducer according to an embodiment of the invention.
Figures 6A, 6B, 6C:
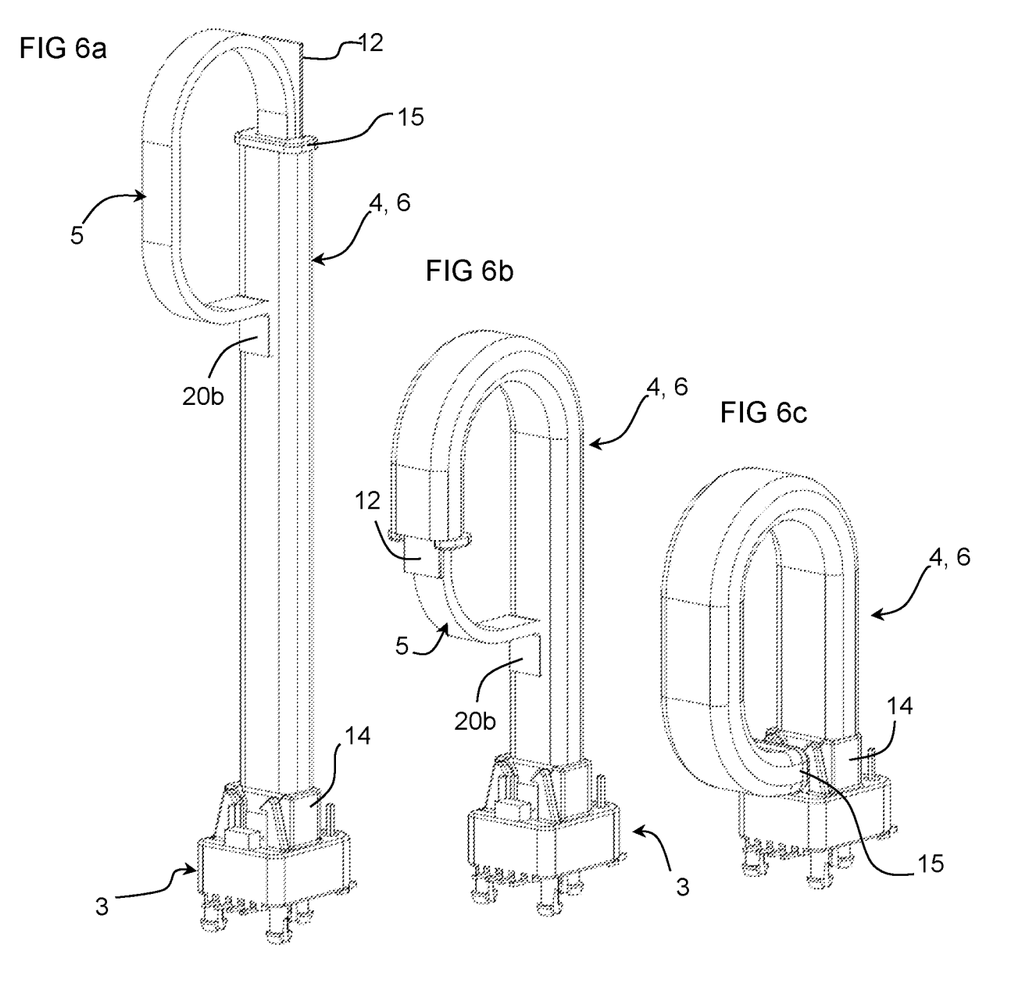

After winding of the coil to the housing as shown in FIGS. 4a, 4b, and 7c, and optionally as in the first embodiment of FIGS. 1a-6c, connection of the wire ends of the coil to the coil connection terminals 8, the magnetic core 5 may be inserted in the coil support 4. This is best seen in FIGS. 5, 6 and 7d whereby the first end 20a of the magnetic core 5 is inserted into the core receiving channel 13 of the coil support at the free end portion 15.

Initially, the coil support is straight and in the embodiment of FIGS. 1a-6c, the first section of magnetic core 5 from the first end 20a is also straight and can be inserted in the axial direction A at a certain depth in the channel 13 as illustrated in FIGS. 5a and 6a. Further insertion of the magnetic core 5 in the core receiving channel 13 of the coil support 4 causes the core support to bend around following the profile of the magnetic core 5 as shown in FIGS. 5b and 6b. The magnetic core 5 can be further inserted by displacing it towards the base 3 of the housing such that the coil support 4 with the coil 6 thereon reaches the fully inserted position as shown in FIGS. 5c and 6c. In the fully inserted position, the second end 20b of the magnetic core 5 is inserted into the core second end lodging cavity 17 of the base 3 of the housing 2. The magnetic circuit gap is defined by the positioning of the first and second ends 20a and 20b of the magnetic core 5 guided by the respective lodging cavities 16, 17.

In the embodiment of FIGS. 7a-7d, the magnetic core 5 extends around in a closed ring shape more than 360° such that the core ends 20a, 20b overlap a section of core. In the illustrated second embodiment, the magnetic core extends about 720° around the circle. The core may have a substantially circular shape as illustrated in FIGS. 7b and 7d, however other shapes may be implemented such as elliptical or oval shapes. The overlapping core sections may be formed such that they are in contact (lie against each other), or are separated by a small gap, prior to insertion into the channel 13 of the coil support. During insertion, over a rotation of 360° of the magnetic core 5 relative to the coil support 4, the overlapping sections are prised apart by the free end portion 15 of the coil support. The coil support may be further rotated until the entire magnetic core 5 is inserted into the channel 13. An advantage of the overlapping core is to reduce the effect of the airgap formed in the magnetic circuit at the interface between the joining ends and sections of the magnetic core. Another advantage of the overlapping magnetic core is the overall increased cross section of the magnetic core while providing a strip forming the magnetic core that is of a lesser thickness, providing greater elasticity for the insertion process to avoid plastic deformation of the magnetic core.

In the embodiment of FIGS. 1a-6c, locking elements 19 may be provided on the housing base 3 to engage the magnetic core 5 near its end 20b in its fully inserted position. In the illustrated embodiment the locking elements 19 are in the form of elastic clips however barbs and other interference fit elements or clamping mechanisms may be employed to secure the magnetic core to the housing in the fully assembled position.

In the embodiment of FIGS. 1a-6c, the thickness of the coil and radially inner support portion 10 of the coil support 4 may be slightly greater that the width of the air gap in the magnetic core, however the thickness relative to the air gap is such that the extension of the air gap does not cause a plastic deformation of the magnetic core which remains in the elastic domain.

In a variant (not shown) of the embodiment of FIGS. 7a-7d, the housing may further comprise a housing base at one end of the coil support. The housing base may be similar to the housing base of the first embodiment (except that it does not, in this example as illustrated, accommodate a magnetic field detector in an airgap), comprising terminals for connection of the coil ends and/or features for mounting on a circuit board or for connection to an external connector.

The invention advantageously allows easy winding of a coil on a housing 2 with cost effective and easy assembly to a magnetic core without causing plastic deformation of the core, thus ensuring reliable accurate performance of the current transducer. Advantageously, the coil 6 may have a large number of windings by extending almost the full length of the magnetic core from the first end 20a to the second end 20b.

During the insertion of the magnetic core in the core receiving channel 13 of the coil support, upon engaging the bent portions of the magnetic core 5, the radially outer support portion 12, which is longer than the radially inner support portion 10, slides along the outer radial surface of the magnetic core 5 relative to the radially inner support portion 10. The latter allows to adjust for the different path lengths of the radially inner side and radially outer side.

LIST OF REFERENCES USED

Current transducer 1
  Housing 2
    Base 3
      Core first end lodging cavity 16
      Core second end lodging cavity 17
      Magnetic field detector lodging cavity 18
      Locking elements 19
        Clips
      Mounting face 23
      Circuit board fixing elements 24
    Coil support 4
      Radially inner support portion 10
        Spacer elements 11
      Radially outer support portion 12
      Core receiving channel 13
      Base end portion 14
      Free end portion 15
  Magnetic core 5
    First end 20a
    Second end 20b
    Bend 21
    Magnetic circuit gap (air gap)
  Coil 6
  Magnetic field detector 7
    Connection terminals 25
    Coil connection terminals 8
    Central passage for primary conductor 9

The invention claimed is:

1. Current transducer comprising: a housing comprising a coil support; a magnetic core extending between a first end and a second end; and a coil comprising a plurality of windings formed around the coil support, the coil support comprising a core receiving channel within which the magnetic core is inserted, the coil support comprising a radially inner support portion and a radially outer support portion between which the core receiving channel is disposed, characterized in that the radially inner support portion is slidably movable with respect to the radially outer support portion.

2. The current transducer according to claim 1, wherein the coil support comprises spacer elements arranged between the radially inner support portion and the radially outer support portion, configured to allow relative displacement between the radially and inner support portion and the radially outer support portion while maintaining a space between the support portions, to form the core receiving channel.

3. The current transducer according to claim 2, wherein the spacer elements are in the form of tabs arranged along lateral edges of the radially inner and radially outer support portions.

4. The current transducer according to claim 3, wherein there are between three and ten spacer elements on each lateral side of the coil support.

5. The current transducer according to claim 4, wherein there are between four and eight spacer elements on each lateral side of the coil support.

6. The current transducer according to claim 2, wherein the spacer elements are formed integrally extending from the radially inner support portion.

7. The current transducer according to claim 1, wherein the housing further comprises a base from which extends the coil support.

8. The current transducer according to claim 7, wherein the coil support is integrally formed with and extends from the base of the housing.

9. The current transducer according to claim 7, wherein the first end and second end of the magnetic core are inserted in respective cavities in the base of the housing.

10. The current transducer according to claim 7, wherein the base comprises elastic clips or barbs engaging the magnetic core at its second end for locking the magnetic core in its fully assembled position to the housing.

11. The current transducer according to claim 7, wherein the magnetic core extends between the first end and the second end forming a magnetic circuit gap therebetween.

12. The current transducer according to claim 11, wherein the housing base comprises a mounting face configured for mounting on a circuit board, a magnetic field detector being inserted in a magnetic field detector lodging cavity extending into the housing from the mounting face such that the magnetic field detector is insertable in the housing through the mounting face.

13. The current transducer according to claim 11, wherein the first end of the magnetic core is arranged parallel to the second end of the magnetic core forming the magnetic circuit gap therebetween, the second end connected to a main portion of the magnetic core via a bend, for instance an approximately right angle bend.

14. Method of assembling a current transducer according to claim 7, wherein the first end of the magnetic core is inserted into the core receiving channel of the core support from a free end, the magnetic core being translated in an axial direction (A) towards the base of the housing.

15. The current transducer according to claim 1, wherein the magnetic core extends around in a closed ring shape more than 360° such that the core ends overlap a section of the magnetic core.

16. The current transducer according to claim 15, wherein the magnetic core extends around about 720°.

17. The current transducer according to claim 1, wherein the magnetic core comprises an essentially rectangular cross-sectional profile, the magnetic core being formed from a rectangular strip of soft magnetic material.

18. Method of assembling a current transducer according to claim 1, wherein the coil is wound around the coil support prior to assembly of the core support to the magnetic core, the core support being in an essentially linear shape during the winding of the coil.

19. Method according to claim 18, wherein the coil is wound around the core support of the housing by fixing the housing in a rotatable tool, the housing being rotated while a wire forming the coil is fed and laterally displaced between the first end and second end of the coil support in a to and fro motion during the rotation of the housing.

\* \* \* \* \*